US006218267B1

United States Patent
Liu

(10) Patent No.: US 6,218,267 B1
(45) Date of Patent: Apr. 17, 2001

(54) SHALLOW TRENCH ISOLATION METHOD OF A SEMICONDUCTOR WAFER

(75) Inventor: Jacson Liu, Hsin-Chu Hsien (TW)

(73) Assignee: Mosel Vitelic Inc., Hsin-chu (TW)

( * ) Notice: Subject to any disclaimer, the term of this patent is extended or adjusted under 35 U.S.C. 154(b) by 0 days.

(21) Appl. No.: 09/192,019

(22) Filed: Nov. 11, 1998

(30) Foreign Application Priority Data

Aug. 31, 1998 (CH) ................................................ 87114432

(51) Int. Cl.[7] ................................................ H01L 21/762
(52) U.S. Cl. ........................ 438/431; 438/437; 438/692; 438/699
(58) Field of Search ..................... 438/424, 427, 438/431, 437, FOR 227, 692, 699; 148/DIG. 50

(56) References Cited

U.S. PATENT DOCUMENTS 5,661,073 * 8/1997 Jeng .
5,930,646 * 7/1999 Gerung et al. .
6,037,237 * 3/2000 Park et al. .

* cited by examiner

*Primary Examiner*—George Fourson
(74) *Attorney, Agent, or Firm*—Winston Hsu

(57) ABSTRACT

The present invention relates to a shallow trench isolation method of a semiconductor wafer for filling dielectric material in each shallow trench between components on the surface of the semiconductor wafer to isolate the components electrically and prevent dishing when the chemical-mechanical polishing is performed on the surface of dielectric material in each shallow trench. The method comprises: (1) covering the surface of the semiconductor wafer with the dielectric material to form a first dielectric layer, filling the dielectric material in each shallow trench on the surface of the semiconductor wafer and the corresponding dish being formed above each shallow trench; (2) forming the second dielectric layer in each dish of the first dielectric layer; (3) polishing the surface of the semiconductor wafer to strip off the second dielectric layer in each dish of the first dielectric layer and cutting the surface of dielectric material in each shallow trench and on each component on the surface of the semiconductor wafer.

5 Claims, 5 Drawing Sheets

SHALLOW TRENCH ISOLATION METHOD OF A SEMICONDUCTOR WAFER

BACKGROUND OF THE INVENTION

1. Field of the Invention

The present invention relates to a shallow trench isolation method of a semiconductor wafer.

2. Description of the Prior Art

Typically, the localized oxidation isolation (LOCOS) method is used for isolating many MOS transistors on a semiconductor wafer to prevent inter-component disturbances or short-circuiting. Using the LOCOS method of oxidizing the silicon substrate at high temperatures, a SiO2 layer (field oxide layer) with several thousand angstroms of distance between two transistor components is generated. However, pits, crystal defects or a bird's beak deformity may form to negatively affect the semiconductor wafer characteristics. The larger volume of the SiO2 layer will affect the integration of the whole semiconductor wafer.

At present, the most commonly used isolation method for isolating MOS transistors in semiconductor processing less than 0.25 μm is shallow trench isolation. Although this method effectively achieves electrical isolation by filling dielectric material in the shallow trench between any two neighboring components within the semiconductor wafer, there is still a possibility of the dishing phenomenon occurring on the surface of shallow trench. This may affect the electrical performance of the semiconductor wafer. Please refer to FIGS. 1 to 6. FIGS. 1 to 6 show the prior art shallow trench isolation method for a semiconductor wafer.

As shown in FIG. 1, a plurality of shallow trenches 12 are formed on the surface of a semiconductor wafer 10 by performing photolithography and etching. The semiconductor wafer 10 comprises a Si substrate 14, a pad oxide layer 16 composed of SiO2 formed over the Si substrate 14, and a pad nitride layer 18 composed of Si3N4 deposited over the pad oxide layer 16. The pad oxide layer 16 and pad nitride layer 18 are used as masks or sacrificial layers during ion implantation or heat diffusion.

A Si(OC2H5)4 (tetra-ethyl-ortho-silicate TEOS) layer and a Poly-Silicon layer are deposited in the proper sequence by performing chemical vapor deposition (CVD). As shown in FIG. 2, a TEOS layer 20 evenly covers the surface of the semiconductor wafer 10 and is used as a dielectric layer, and a Poly-Silicon layer 22 is used as a mask.

The unnecessary parts of the Poly-Silicon layer 22 are stripped and the surface of the semiconductor wafer 10 is polished by performing chemical-mechanical polishing (CMP). As shown in FIG. 3, the Poly-Silicon 24 in the corresponding dishes above the shallow trenches 12 remains, and the surface of the semiconductor wafer 10 is flat.

The remaining Poly-Silicon 24 and TEOS layer 20 are etched on the surface of the semiconductor wafer 10 by performing reactive ion etching or magnetically enhanced reactive ion etching. Please refer to FIG. 4. When reactive ion etching is performed, the remaining Poly-Silicon 24 will function as a mask above the shallow trench 12. Therefore, after etching, several remaining overhangs 26 are formed above the shallow trenches 12. The remaining TEOS layer 20 and several overhangs 26 are tightened by annealing the semiconductor wafer 10.

Afterwards, the remaining overhangs 26 will be eliminated and the surface of the semiconductor wafer 10 will be polished by performing CMP. As shown in FIG. 5, the surface of the semiconductor wafer 10 is flat. The pad oxide layer 16 and pad nitride layer 18 on the surface of the semiconductor wafer 10 are then stripped. As shown in FIG. 6, only Si substrate 14 and several shallow trenches 12 comprising TEOS are left on the surface of semiconductor wafer 10.

When performing the CMP and back etching techniques as shown in FIG. 5 and FIG. 6, the surface of TEOS in the shallow trench 12 is etched and a dish 28 is generated. The wider the surface, the more serious the dishing problem. Dishing affects the semiconductor wafer 10 electrically during film layer deposition and causes focusing problems when transferring patterns.

SUMMARY OF THE INVENTION

It is therefore a primary objective of the present invention to provide a shallow trench isolation method of a semiconductor wafer where dishing does not occur to solve the above mentioned problem.

In a preferred embodiment, the present invention relates to a method for electrically isolating shallow trenches between components on the surface of a semiconductor wafer comprising:

(1) covering the surface of the semiconductor wafer with the dielectric material to form a first dielectric layer, filling each shallow trench on the surface of the semiconductor wafer and the corresponding dish above each shallow trench with dielectric material;

(2) depositing a second dielectric layer in each dish of the first dielectric layer;

(3) polishing the surface of the semiconductor wafer to strip off the second dielectric layer in each dish of the first dielectric layer and cutting the surface of dielectric material in each shallow trench and on each component on the surface of the semiconductor wafer.

It is an advantage of the present invention that dishing is avoided so the semiconductor wafer will not be affected electrically and focusing problems when transferring patterns will not occur.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

The present invention relates to a shallow trench isolation method of a semiconductor wafer. The method is to fill dielectric material into each shallow trench between components on the surface of the semiconductor wafer thus electrically isolating them and preventing dishing from occurring on the surface of the dielectric material. At the same time, the shallow trench isolation process is simplified.

Figure 1:
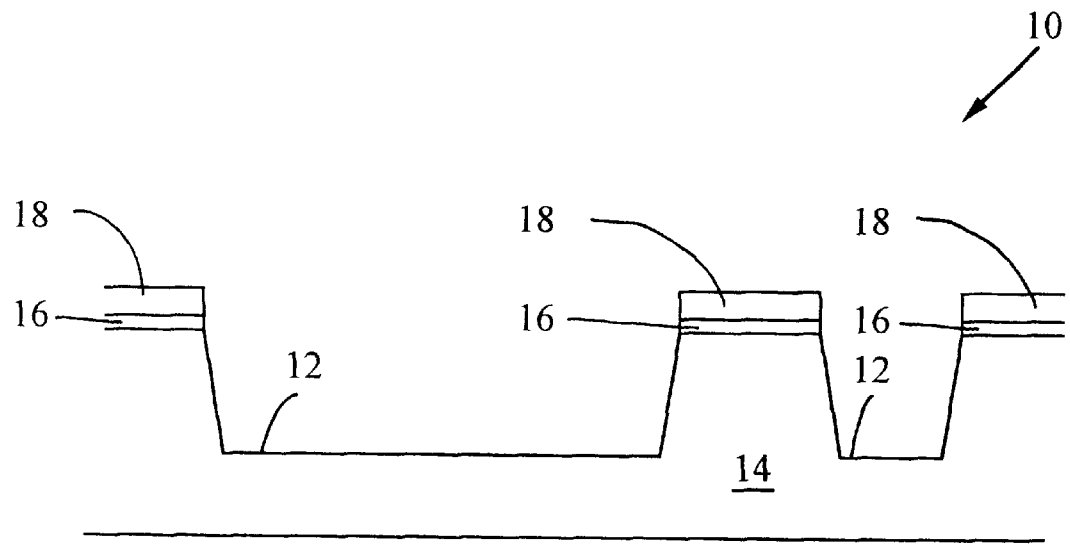
FIG. 1 to FIG. 6 show the prior art shallow trench isolation method of a semiconductor wafer.
Figure 2:
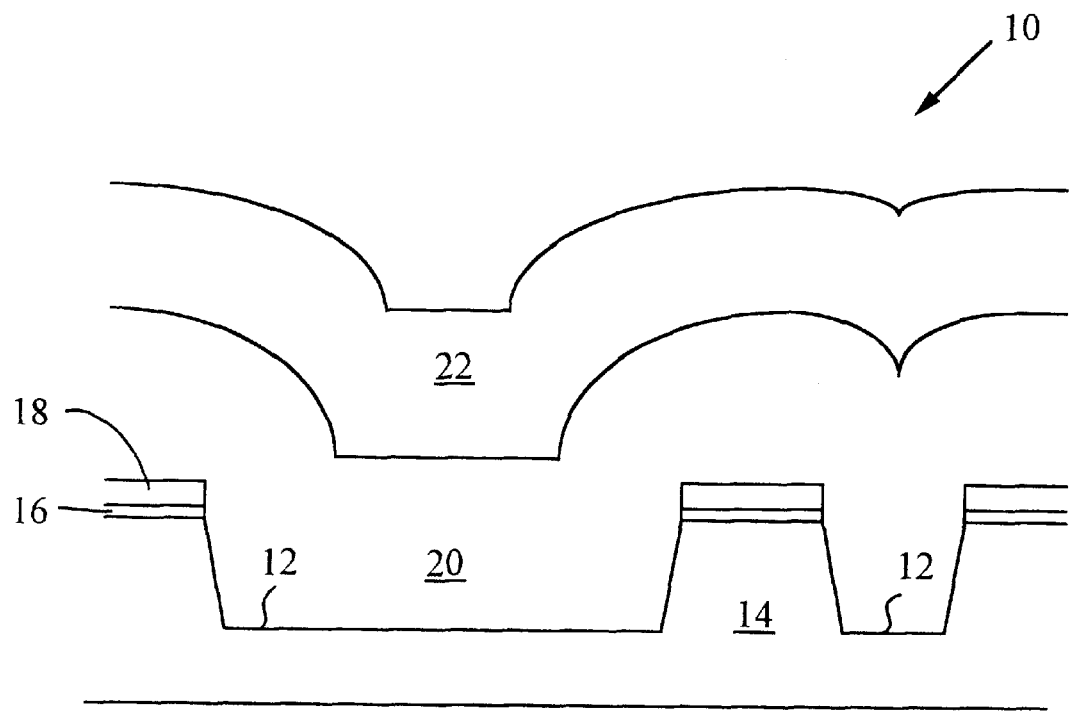
Figure 3:
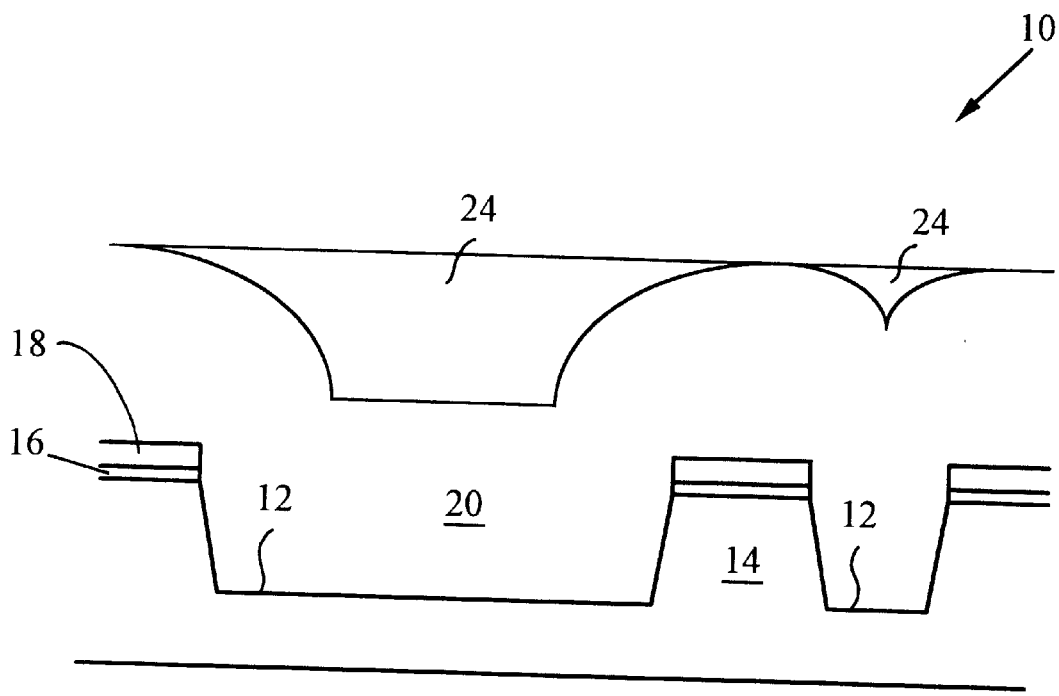
Figure 7:
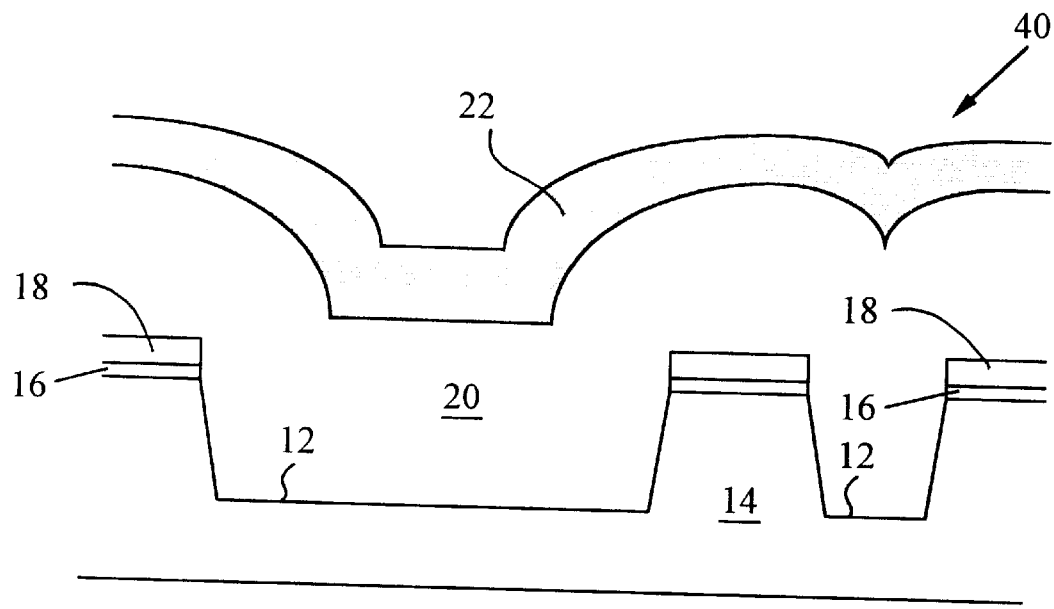
FIG. 7 and FIG. 8 show the steps of another shallow trench isolation method according to the present invention.
Figure 8:
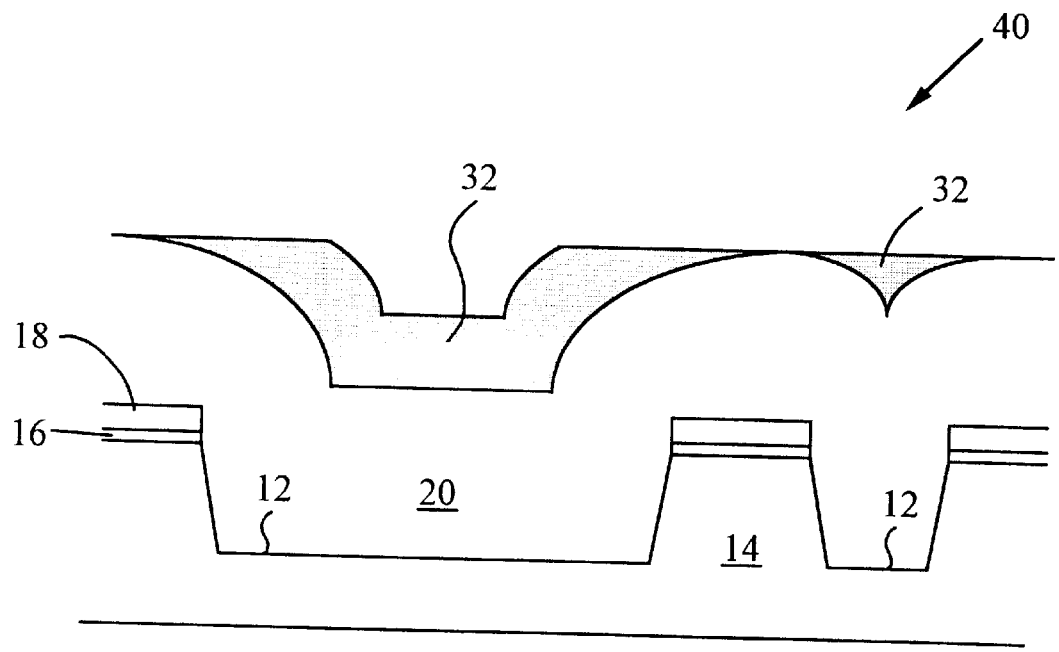

As shown in FIG. 1 to FIG. 3, a semiconductor wafer 40 comprises a Si substrate 14, a pad oxide layer 16, a pad nitride layer 18 and a plurality of shallow trenches 12. A TEOS layer 20 is deposited by performing CVD, covers the surface of the semiconductor wafer and is used as a first dielectric layer. A poly-silicon layer 22 is deposited onto the surface of the TEOS layer 20 and is used as a mask. Finally, the unnecessary parts of the Poly-Silicon layer 22 on the surface of the semiconductor wafer 40 are eliminated by performing CMP which levels the surface of the semiconductor wafer 40 into a plane. The Poly-Silicon 24 in the corresponding dishes above the shallow trenches 12 remain. The thickness of the poly-silicon layer 22 is variable and can be adjusted based on product requirements or the size of the shallow trenches 12. Please refer to FIG. 7 and FIG. 8. FIG. 7 and FIG. 8 show the steps of another shallow trench isolation method according to the present invention. FIG. 7 shows depositing a polysilicon layer 22 onto the surface of the TEOS layer 20. After polishing the surface of the semiconductor wafer 40 by performing CMP, as shown in FIG. 8, a slightly undulating surface is formed.

Figure 9:
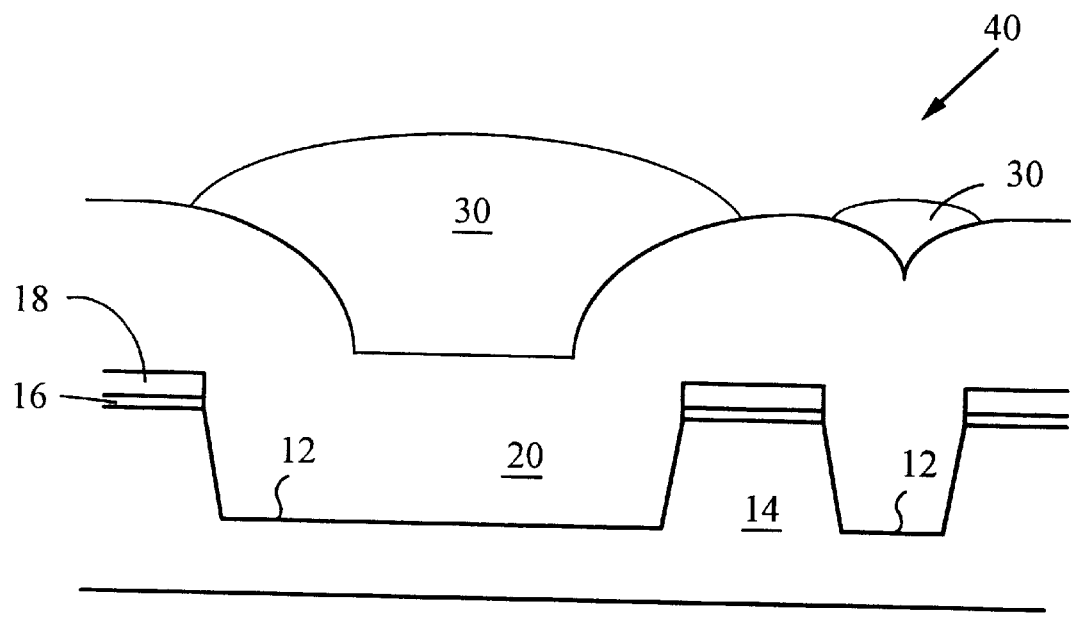
FIG. 9 shows the steps of a shallow trench isolation method according to the present invention.

As shown in FIG. 9, the TEOS layer 20 is tightened by oxidizing the semiconductor wafer 40 at high temperature. The Poly-Silicon 24 above the shallow trench 12 is oxidized and expands to form the raised second dielectric layer 30 composed of SiO2. The volume of the expanded second dielectric layer 30 is 2.2 times the volume of the Poly-Silicon 24 in the dishes of TEOS layer 20.

Figure 10:
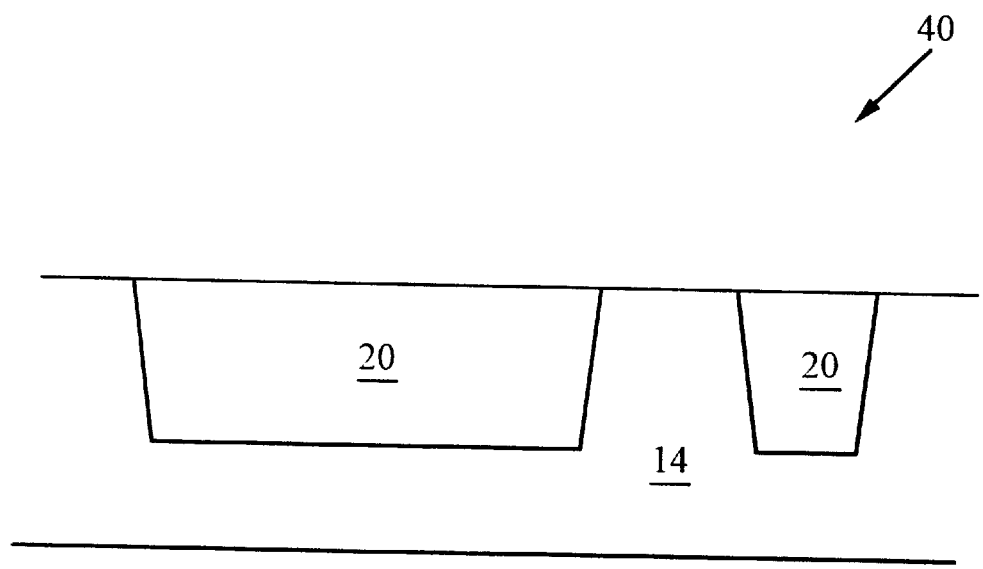
FIG. 10 is a perspective diagram of the completion of the shallow trench isolation method according to the present invention.

Finally, the second dielectric layer 30 and parts of the TEOS layer 20 are polished by CMP, then the pad oxide layer 16 and pad nitride layer 18 are stripped by etching. Please refer to FIG. 10. FIG. 10 is a perspective diagram of the completion of the shallow trench isolation method according to the present invention. Only a Si substrate 14 and a plurality of shallow trenches 12 comprising TEOS are left on the surface of semiconductor wafer 40 which is an intact plane.

Figure 4:
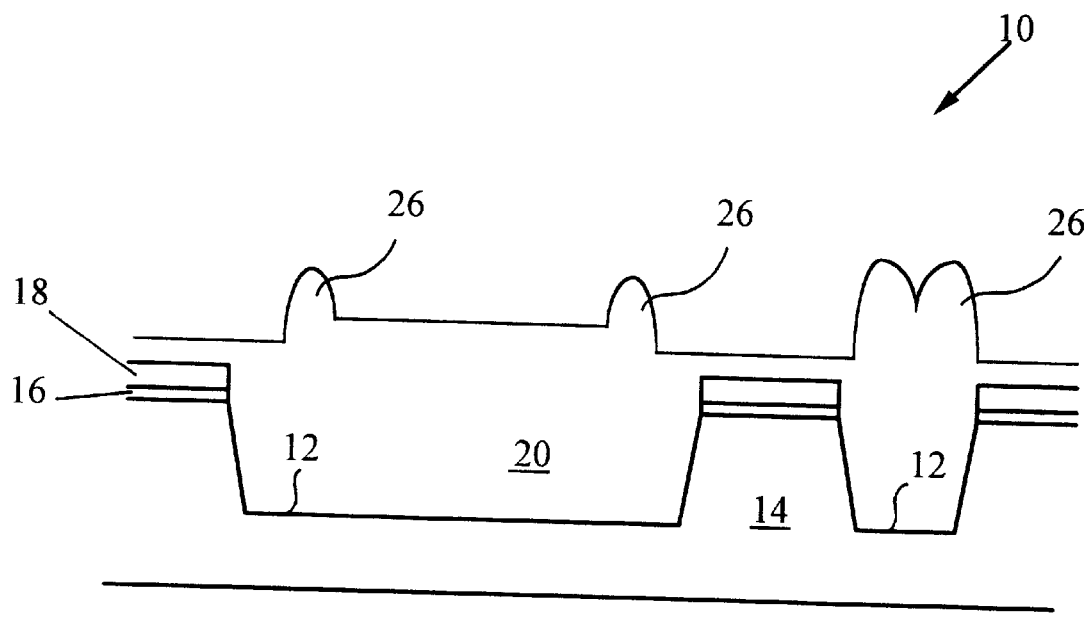
Figure 5:
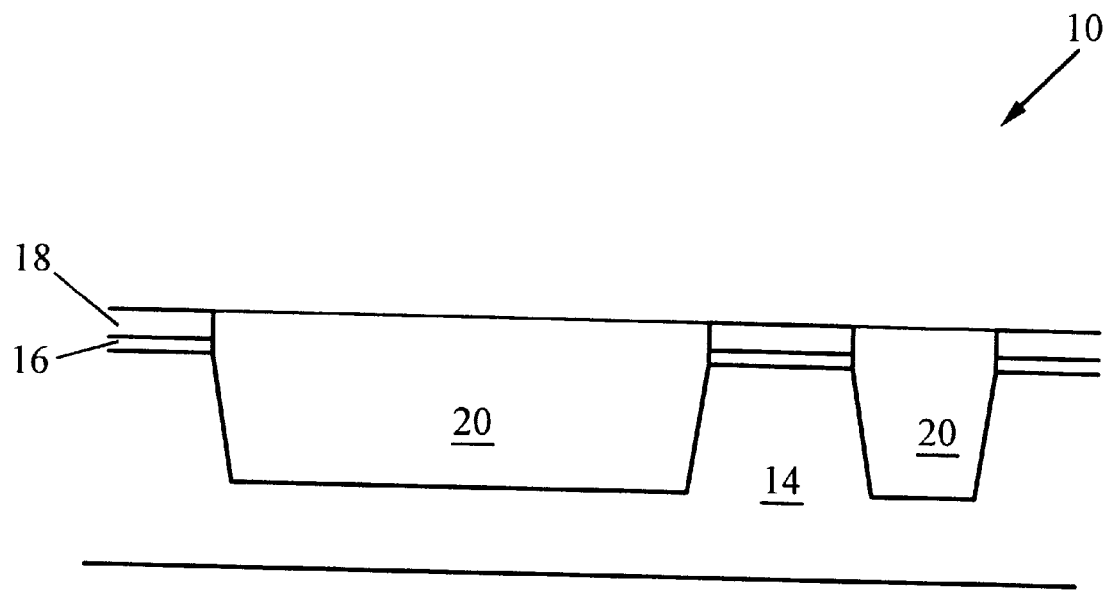
Figure 6:
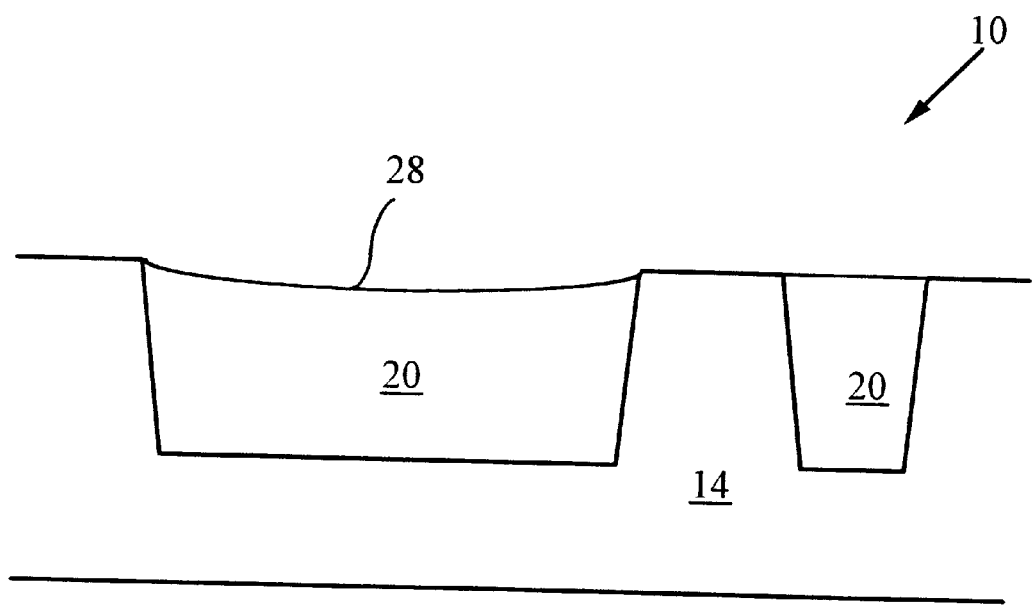

Oxidization at high temperature is the same as the annealing of the prior art shallow trench isolation. The atoms in the TEOS layer 20 are rearranged to reduce the defect density of the TEOS layer 20 and the Poly-Silicon 24 is oxidized and expands to form the raised and tight second dielectric layer 30 composed of SiO2. Compared to the plurality of overhangs 26 in FIG. 4, the second dielectric layer 30 of the shallow trench isolation method according to the present invention has a tighter structure and the size of the Poly-Silicon 24 remaining in the dishes of the TEOS layer 20 can be modified by depositing the Poly-Silicon layer 22 at different thicknesses. The form and size of the second dielectric layer 30 can be controlled. Therefore, when performing CMP and etching, the surface of the TEOS material will not be etched excessively and the dishing as shown in FIG. 6 will not occur.

The Poly-Silicon layer 22 for forming the second dielectric layer 30 can be replaced by an amorphous silicon layer with an amorphous structure. When the amorphous silicon layer is oxidized at high temperature, the amorphous silicon layer will also expand to form the second dielectric layer 30 composed of SiO2. Thus, after performing CMP, the surface of the semiconductor wafer 40 will become a plane without dishes.

The shallow trench isolation method according to the present invention simplifies the annealing process and Poly-Silicon 24 is directly oxidized at high temperature to form the second dielectric layer 30 without performing reactive ion etching or magnetically enhanced reactive ion etching. The dishing on the surface of the shallow trench 12 can be avoided, and focusing problems when transferring patterns will not occur. Thus, the semiconductor wafer will not be affected electrically.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method for forming electrically isolating shallow trenches between components on the surface of a semiconductor wafer, the surface of the semiconductor wafer comprising a plurality of trenches, the method comprising:

(1) covering the surface of the semiconductor wafer with a dielectric material to form a first dielectric layer, filling each shallow trench on the surface of the semiconductor wafer with the dielectric material to form a corresponding recess for each shallow trench;

(2) forming a silicon layer over the first dielectric layer;

(3) performing a chemical-mechanical polishing process to planarize the silicon layer so that only the portions of the silicon layer in the recesses remains on the surface of the first dielectric layer;

(4) oxidizing the remaining portions of the silicon layer to expand the remaining portions of the silicon layer to form a second dielectric layer; and (5) performing a planarization process on the surface of the semiconductor wafer to strip the second dielectric layer, and to align the surface of the first dielectric layer inside each shallow trench with the surface of each component on the surface of the semiconductor wafer.

2. The shallow trench isolation method of claim 1 wherein the dielectric material is TEOS and is deposited onto the surface of the semiconductor wafer by chemical vapor deposition to form the first dielectric layer.

3. The shallow trench isolation method of claim 1 wherein the silicon layer has an amorphous structure.

4. The shallow trench isolation method of claim 1 wherein the silicon layer is a poly-silicon layer with a poly-crystalline structure.

5. The shallow trench isolation method of claim 1 wherein the planarization process performed on the first dielectric layer is chemical-mechanical polishing.

* * * * *